(12) United States Patent
Im et al.

(10) Patent No.: US 11,952,471 B2
(45) Date of Patent: Apr. 9, 2024

(54) ULTRATHIN AND STRETCHABLE POLYMER DIELECTRIC AND ITS FORMATION METHOD

(71) Applicant: Korea Advanced Institute of Science and Technology, Daejeon (KR)

(72) Inventors: SungGap Im, Daejeon (KR); Juyeon Kang, Daejeon (KR); Junhwan Choi, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 316 days.

(21) Appl. No.: 17/024,857

(22) Filed: Sep. 18, 2020

(65) Prior Publication Data

US 2021/0087346 A1  Mar. 25, 2021

(30) Foreign Application Priority Data

Sep. 20, 2019  (KR) .................... 10-2019-0115918
Mar. 30, 2020  (KR) .................... 10-2020-0038184

(51) Int. Cl.
*C08J 5/18*  (2006.01)
*B05D 1/00*  (2006.01)
*C23C 14/06*  (2006.01)

(52) U.S. Cl.
CPC .................. *C08J 5/18* (2013.01); *B05D 1/60* (2013.01); *C08J 2333/08* (2013.01); *C23C 14/06* (2013.01)

(58) Field of Classification Search
CPC ...... C08J 5/15; C08J 2333/08; C08J 2335/06; B05D 1/60; C23C 14/06
USPC ........................................ 427/255.6
See application file for complete search history.

(56) References Cited

U.S. PATENT DOCUMENTS

| | | | |
|---|---|---|---|
| 2009/0130360 A1* | 5/2009 | Damman | B29C 55/023 428/41.3 |
| 2012/0237747 A1* | 9/2012 | Tai | B32B 27/18 428/212 |
| 2012/0238703 A1* | 9/2012 | Niederst | C09D 133/066 525/328.8 |
| 2018/0163041 A1* | 6/2018 | Abgrall | B32B 27/304 |
| 2019/0002617 A1* | 1/2019 | Kotani | C09J 7/385 |
| 2020/0362108 A1* | 11/2020 | Coquet | B32B 27/18 |
| 2023/0295358 A1* | 9/2023 | Hiiro | G02B 1/08 526/329.7 |

FOREIGN PATENT DOCUMENTS

KR   20180117331 A  * 10/2018
KR   1020180117331 B1   10/2018

* cited by examiner

*Primary Examiner* — Brian K Talbot
(74) *Attorney, Agent, or Firm* — Verrill Dana, LLP

(57) ABSTRACT

A polymer thin film having stretchability and dielectric properties and a method of forming the same are provided. The method includes forming the polymer thin film having stretchability and dielectric properties depending on a composition of a copolymer using an acrylate-based monomer and a vinyl group monomer.

5 Claims, 17 Drawing Sheets

Benzyl acrylate

Benzyl 2-ethylacrylate

2-Phenoxyethyl acrylate

Butyl Methacrylate

Hexyl Methacrylate

2-Ethylhexyl methacrylate 1,4-Cyclohexane dimethanol divinyl ether

Di(ethylene glycol) divinyl ether

Ethylene glycol dimethacrylate

Di(ethylene glycol) diacrylate

Ethylene glycol diacrylate 1,3,5-trimethyl-1,3,5-trivinyl cyclotrisiloxane 2,4,6-Trimethyl-2,4,6-trivinylcyclotrisilazane Glyceral dimethacrylate 2,4,6,8-Tetramethyl-2,4,5,8-tetravinylcyclotetrasiloxane Divinylbenzene Hexavinyldisiloxane

ULTRATHIN AND STRETCHABLE POLYMER DIELECTRIC AND ITS FORMATION METHOD

CROSS-REFERENCE TO RELATED APPLICATIONS

A claim for priority under 35 U.S.C. § 119 is made to Korean Patent Application No. 10-2019-0115918 filed on Sep. 20, 2019 and Korean Patent Application No. 10-2020-0038184 filed on Mar. 30, 2020, in the Korean Intellectual Property Office, the entire contents of which are hereby incorporated by reference.

BACKGROUND

Embodiments of the inventive concept described herein relate to a polymer thin film having stretchability and dielectric properties and a method of forming the same, and more particularly, relate to a polymer thin film having stretchability and dielectric properties depending on a composition of a copolymer using a monomer of an acrylate and a monomer of a vinyl group and a method of forming the same.

A cross-linker is polymerized on rubber or an inorganic filler is added to a polymer material having elasticity to form a conventional stretchable dielectric film.

For example, liquid metal (LE) microscopic droplets are added to an elastic polymer material (elastomer) to form insulators such as liquid-metal embedded elastomers (LMEEs) or cross-linked PDMS (cross-linked PDMS) or an elastomer material is cross-linked to form a dielectric film.

However, because the elastomer itself is used, a thickness is thick (in units of micrometers) to require a high driving voltage and not to perform an analysis of dielectric properties.

In a case of CTBN:C6, a cross-linker and a rubber having a functional end-group perform condensation polymerization to form the dielectric film. Meanwhile, the dielectric film formed as described above is also thick (580 nm) using rubber to require a high driving voltage and to have insufficient strain.

As a method for overcoming this problem, the inventive concept uses an acrylate-based monomer as a soft segment and a vinyl group monomer as a hard segment and polymerizes the two monomers, to form polymer thin film having stretchability, durability, and dielectric properties.

SUMMARY

Embodiments of the inventive concept provide a method of forming a polymer thin film having excellent stretchability and dielectric properties by copolymerizing a soft material and a cross-linker.

In addition, embodiments of the inventive concept provide a polymer thin film in which a composition of a soft material and a cross-linker is adjusted to control material properties of the polymer thin film.

According to an exemplary embodiment, a method of forming a polymer thin film includes forming the polymer thin film having stretchability and dielectric properties depending on a composition of a copolymer using an acrylate-based monomer and a vinyl group monomer.

The forming of the polymer thin film may include copolymerizing the acrylate-based monomer as a soft material and the vinyl group monomer as a cross-linker based on an initiated chemical vapor deposition (iCVD) method and forming the polymer thin film having stretchability and dielectric properties through a composition ratio between the acrylate-based monomer and the vinyl group monomer.

In the forming of the polymer thin film, the composition of the copolymer using the acrylate-based monomer and the vinyl group monomer may be adjusted to form the polymer thin film exhibiting a strain rate of 50% or more and a breakdown voltage of 1.5 MV/cm or more, at a thickness of 500 nm or less.

The monomer of the vinyl group may be a monomer representing two or more vinyl groups, which is a cross-linker.

The acrylate-based monomer may represent an acrylate group and an aliphatic hydrocarbon chain connected thereto and exhibits stretchability and dielectric properties depending on being copolymerized with the cross-linker.

The acrylate-based monomer may represent an aliphatic hydrocarbon chain having 8 or more carbons to have a linear structure.

According to an exemplary embodiment, a polymer thin film includes an acrylate-based monomer and a vinyl group monomer, and the polymer thin film is formed depending on a composition of a copolymer using the acrylate-based monomer and the vinyl group monomer to exhibit stretchability and dielectric properties.

According to an exemplary embodiment, a method of forming a polymer thin film includes forming the polymer thin film having stretchability and dielectric properties depending on a composition of a copolymer using an acrylate-based monomer and a cross-linker.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
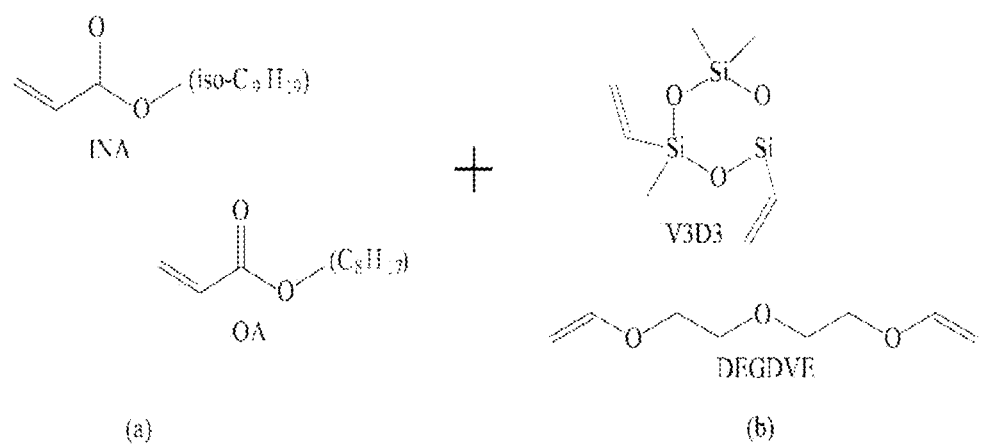
FIG. 1 shows a monomer structure for explaining a method of forming a polymer thin film according to an embodiment of the inventive concept.

Hereinafter, embodiments according to the inventive concept will be described in detail with reference to the accompanying drawings. However, the inventive concept is not restricted or limited by the embodiments. In addition, the same reference numerals shown in each drawing denote the same member.

In addition, terms used herein are terms used to properly express preferred embodiments of the inventive concept, which may vary depending on the intention of viewers or operators, or customs in the field to which the inventive concept belongs. Accordingly, definitions of these terms should be made based on the contents throughout the present specification.

FIG. 1 shows a monomer structure for explaining a method of forming a polymer thin film according to an embodiment of the inventive concept.

In a method of forming a polymer thin film according to an embodiment of the inventive concept, a polymer thin film having excellent stretchability and dielectric properties is formed depending on a copolymer composition using an acrylate-based monomer shown in FIG. 1(a) and a vinyl group monomer shown in FIG. 1(b), even at a thin thickness.

In detail, the method of forming the polymer thin film according to an embodiment of the inventive concept may copolymerize the acrylate-based monomer that is a soft material and the vinyl group monomer that is a cross-linker through a composition ratio therebetween, to form the polymer thin film having excellent stretchability and dielectric properties, based on an initiated chemical vapor deposition (iCVD) method.

Here, in the initiated chemical vapor deposition (iCVD) method, when a free radical is formed by pyrolysis of an initiator, the free radical activates the monomer to induce polymerization of the surrounding monomers, and this reaction continues to result in the polymer thin film.

The 'monomer' of the inventive concept is a material that has volatility in a chemical vapor deposition method and is capable of being activated by the initiator. The monomer may be vaporized under reduced pressure and elevated temperature, and may include for example, the acrylate-based group and the vinyl group, as shown in FIG. 1.

The 'initiator' of the inventive concept is a substance that is decomposed by supply of heat in a reactor to form free radicals and is not particularly limited as long as it is a material capable of activating a monomer. Preferably, the initiator may be peroxide, for example, the radicalized initiator may be tert-butyl peroxide (TBPO). TBPO is a volatile material having a boiling point of about 110° C. and is a material performing pyrolysis around 150° C. Meanwhile, an amount of the initiator may be an amount required for a general polymerization reaction and may be an amount known in the art. For example, the initiator may be added in 0.5 to 5 mol %, but may be not limited to the above range, and may be greater or less than the above range.

A temperature used in the reaction to free radicalize the initiator is sufficient by heat applied from a filament of a gas phase reactor. Therefore, processes used in embodiments of the inventive concept may be sufficiently performed with low power. In addition, a reaction pressure of the gas phase reactor is in a range of 50 to 2000 mTorr, and this means that strict high vacuum conditions are not required, and thus the process may be performed with a single rotary pump instead of a high vacuum pump.

Physical properties of the polymer thin film having stretchability and dielectric properties obtained through the process may be easily controlled by adjusting process parameters of the initiated chemical vapor deposition (iCVD) method. That is, process pressure, time, temperature, flow rate of each of the initiator and monomer, filament temperature, and substrate temperature are controlled by a person skilled in the art according to a purpose to adjust the physical properties such as molecular weight of the polymer thin film, desired thickness, composition, and deposition rate.

For example, the filament at a high temperature of 120° C. to 200° C. may be maintained to induce the gas phase reaction. Here, the temperature of the filament is high enough for TBPO pyrolysis but is a temperature at which most organic substances including other monomers are not pyrolyzed, thereby converting various types of monomers into the thin polymer film without chemical damage.

Through this, the method for forming the polymer thin film according to an embodiment of the inventive concept may use the iCVD method of polymerizing the polymer in a gas phase, and thus the monomers may be polymerized in a uniformly mixed state in the gas phase and a composition ratio of the soft material and the cross-linker may be adjusted to control the material properties of the polymer thin film.

Furthermore, the method of forming the polymer thin film according to an embodiment of the inventive concept may form the polymer thin film showing a strain rate of 50% or more and a breakdown voltage of 1.5 MV/cm or more at a thickness of 500 nm or less by adjusting the physical properties depending on the composition of the copolymer using the acrylate-based monomer and the vinyl group monomer.

Here, the above-described strain of 50% or more and a breakdown voltage of 1.5 MV/cm or more at the thickness of 500 nm or less may be performance of I1V1. In a case of OA2D1, two monomers of the soft material and the cross-linker may have different types and the cross-linker may exhibit a linear structure. Here, the material may exhibit a strain rate of about 60% or more and a breakdown voltage of 2 MV/cm or more at a thickness of 300 nm or less.

As shown in FIG. 1(a), the acrylate-based monomer may represent an acrylate group and an aliphatic hydrocarbon chain connected thereto. When representing a linear structure of an aliphatic hydrocarbon chain having 8 or more carbons, the acrylate-based monomer may show better performance. For example, the acrylate-based monomer may be HEA, GMA, EDGA, OA, EHA, n-BA, iso-BA, IDA, or INA. Here, an acrylate-based monomer having a low glass transition temperature (Tg) of a homopolymer may provide stretchability as the soft material.

In addition, as shown in FIG. 1(b), the monomer of the vinyl group may represent two or more vinyl groups, for example, may be V3D3, EGDMA, DEGDVE, or CHDMDVE. Here, a monomer having two or more vinyl groups may impart dielectric properties as the cross-linker.

The monomer of the vinyl group in FIG. 1(b) may be the cross-linker as a monomer representing at least two vinyl groups. In addition, the acrylate-based monomer in FIG. 1(a) may have the linear structure by representing an acrylate group and an aliphatic hydrocarbon chain having 8 or more carbons connected thereto, to show stretchability and dielectric properties depending on being copolymerized with the cross-linker.

Figure 2A:
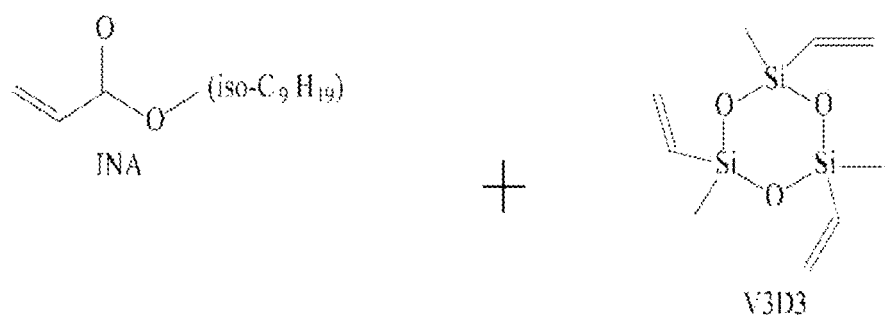
FIGS. 2A and 2B show performance results of a polymer thin film depending on a copolymer composition according to a first embodiment of the inventive concept.
Figure 2B:
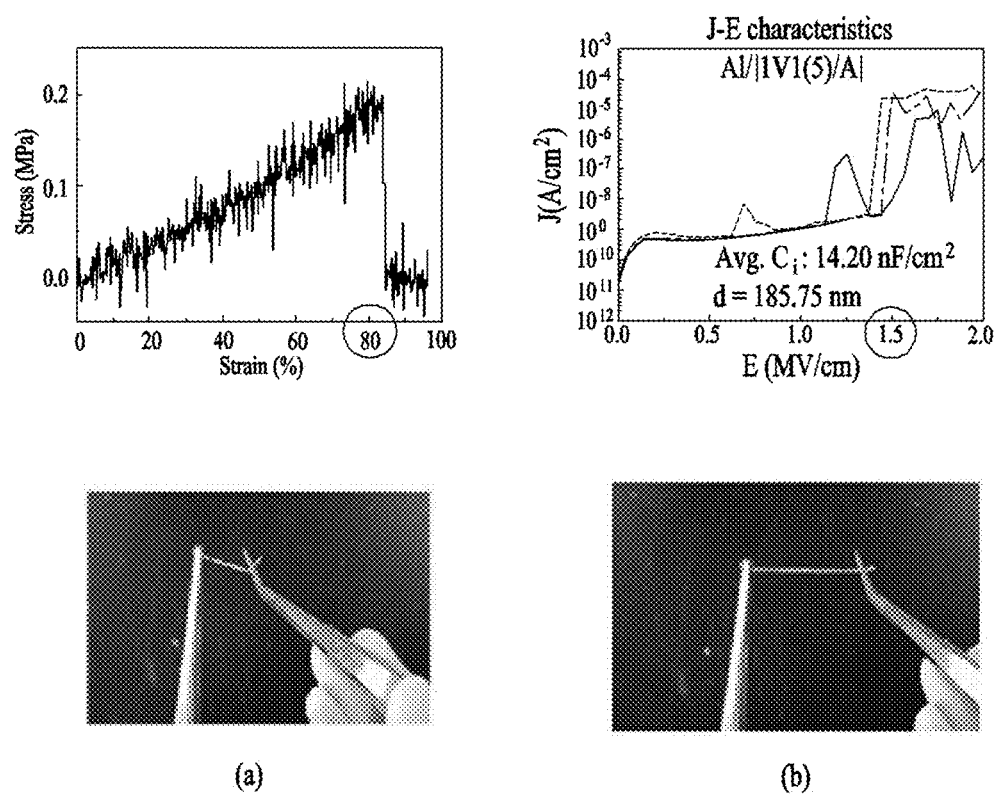

FIGS. 2A and 2B show performance results of a polymer thin film depending on a copolymer composition according to a first embodiment of the inventive concept.

Referring to FIG. 2A, in a first embodiment, INA among acrylate-based monomers and V3D3 among monomers of vinyl group are copolymerized to form a polymer thin film.

Referring to FIG. 2B, performance of the polymer thin film formed by controlling a composition ratio of a soft material and a cross-linker shown in FIG. 2A may be confirmed. It may be seen that the polymer thin film formed by copolymerizing INA and V3D3 withstands a strain of about ~80% and a breakdown voltage of ~1.5 MV/cm at a thickness of 300 nm or less.

Figure 3A:
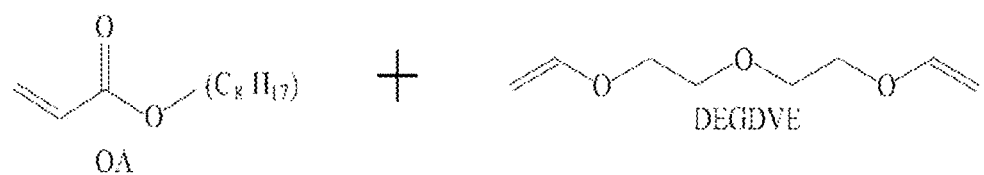
FIGS. 3A and 3B show performance results of a polymer thin film depending on a copolymer composition according to a second embodiment of the inventive concept.
Figure 3B:
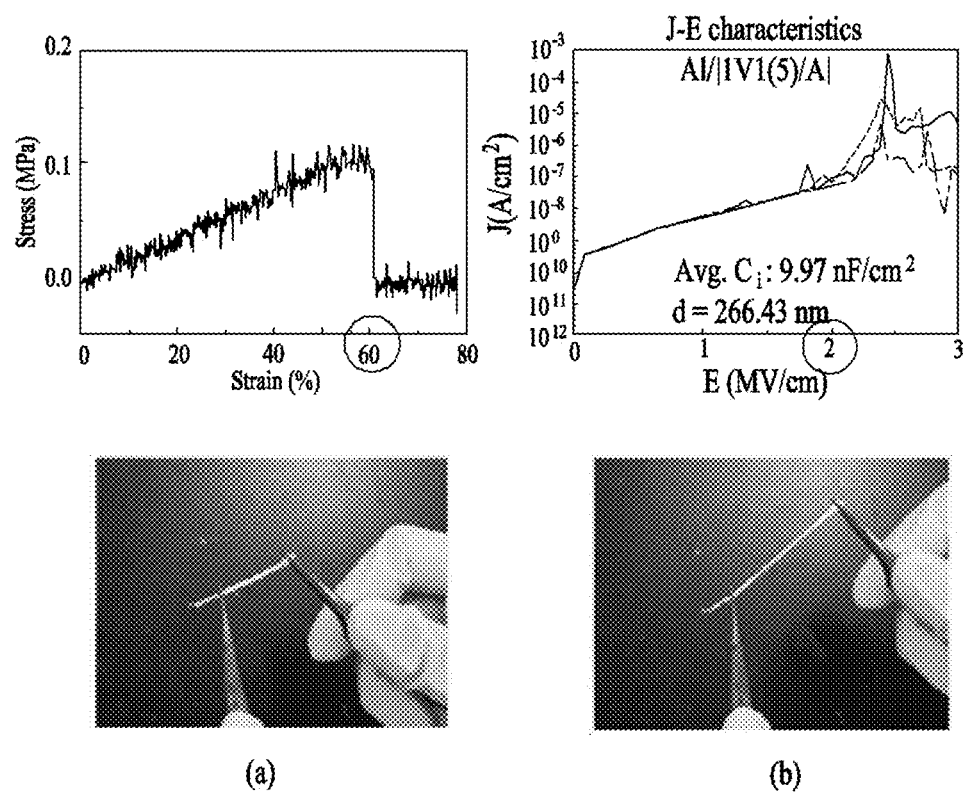
Figure 4A:
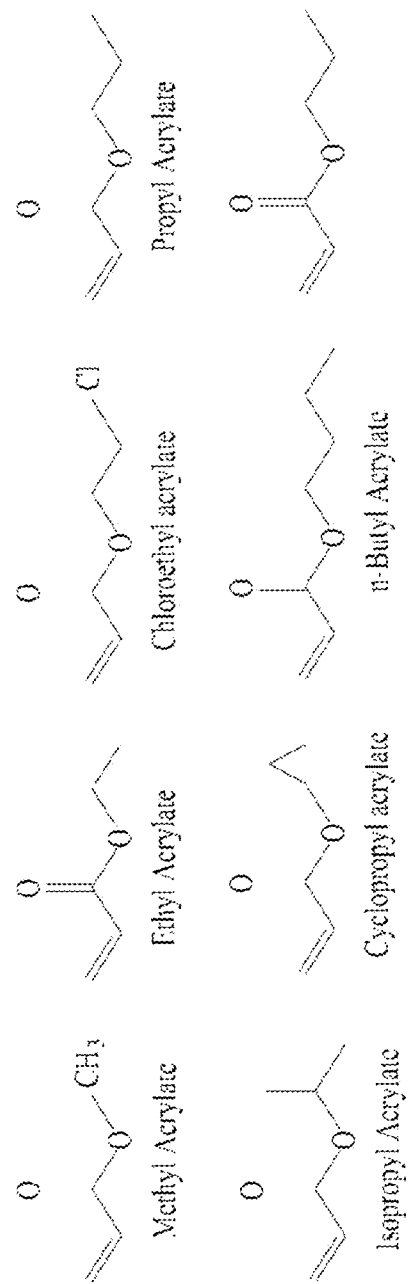
FIGS. 4A to 4I show candidates for a soft material according to an embodiment of the inventive concept.
Figure 4B:
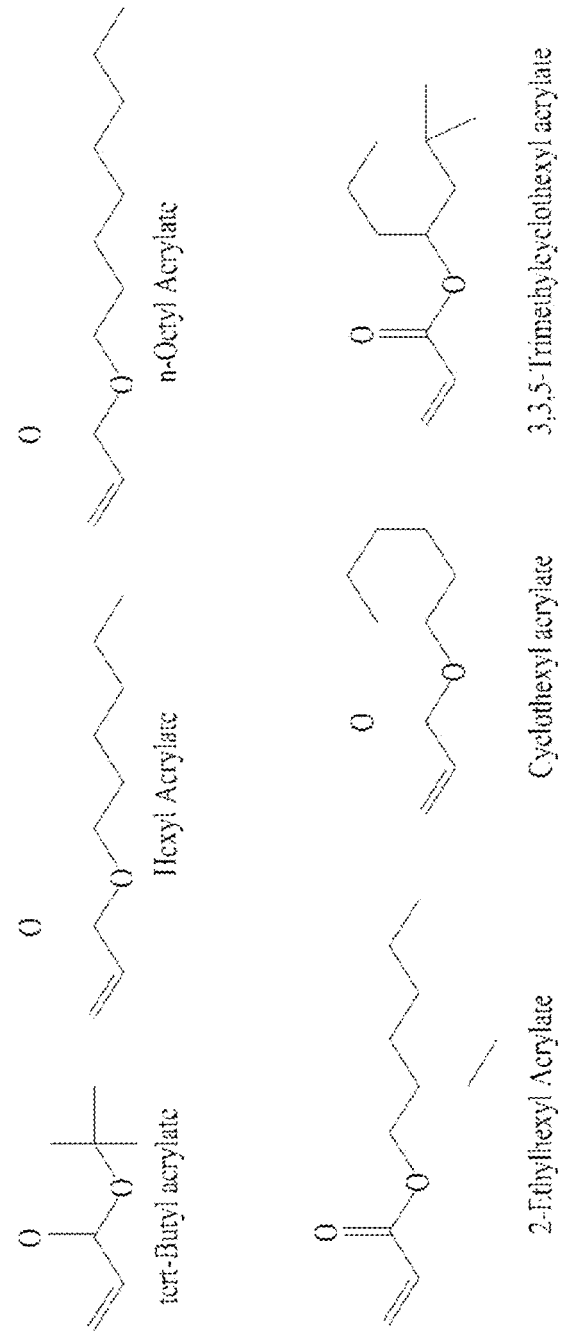
Figure 4C:
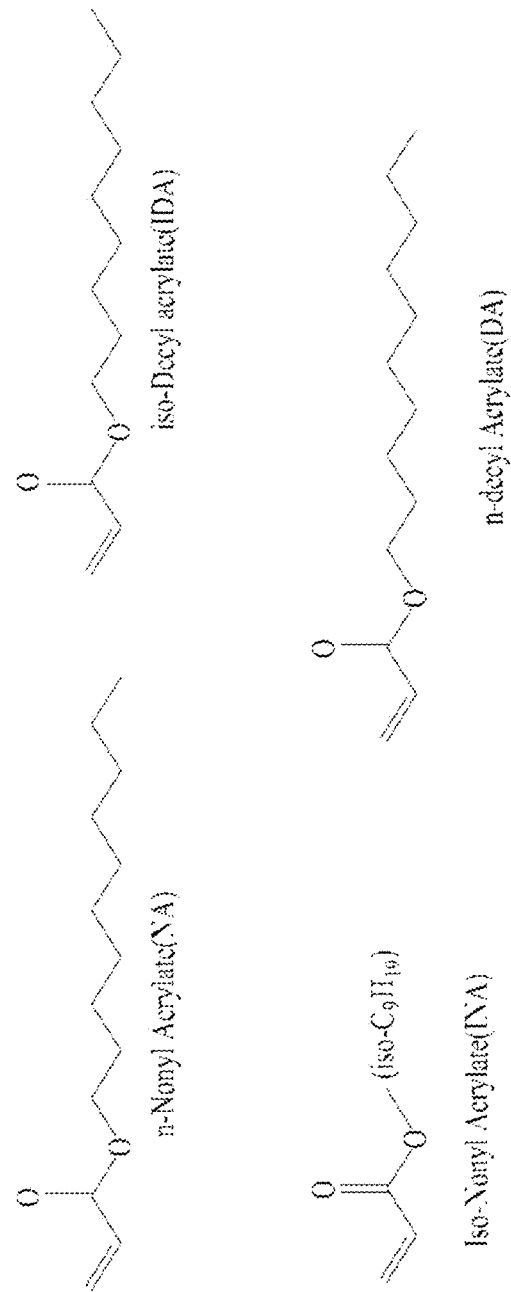
Figure 4D:
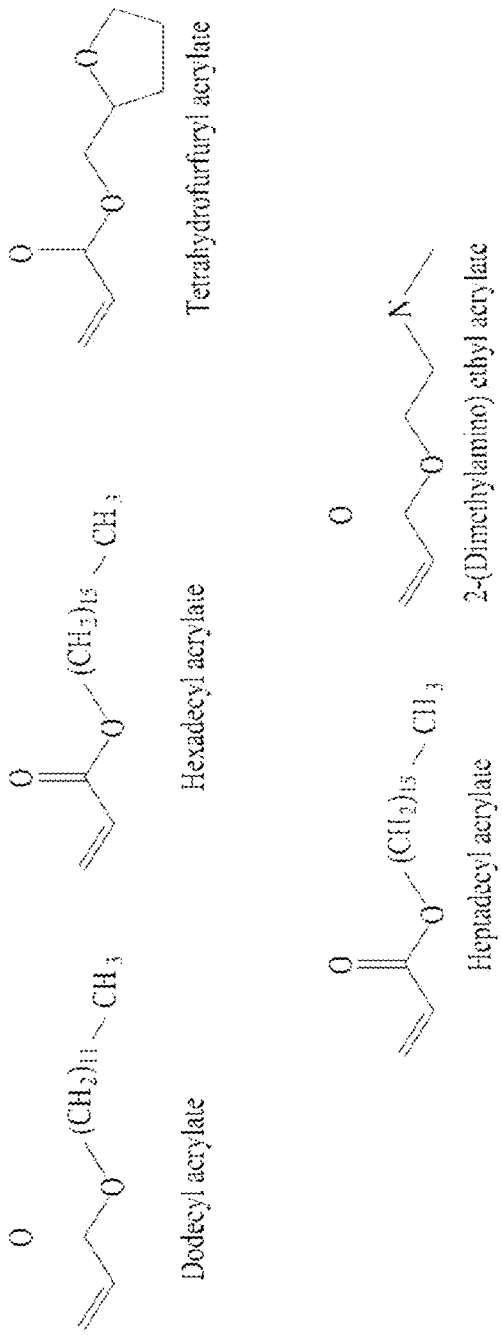
Figure 4E:
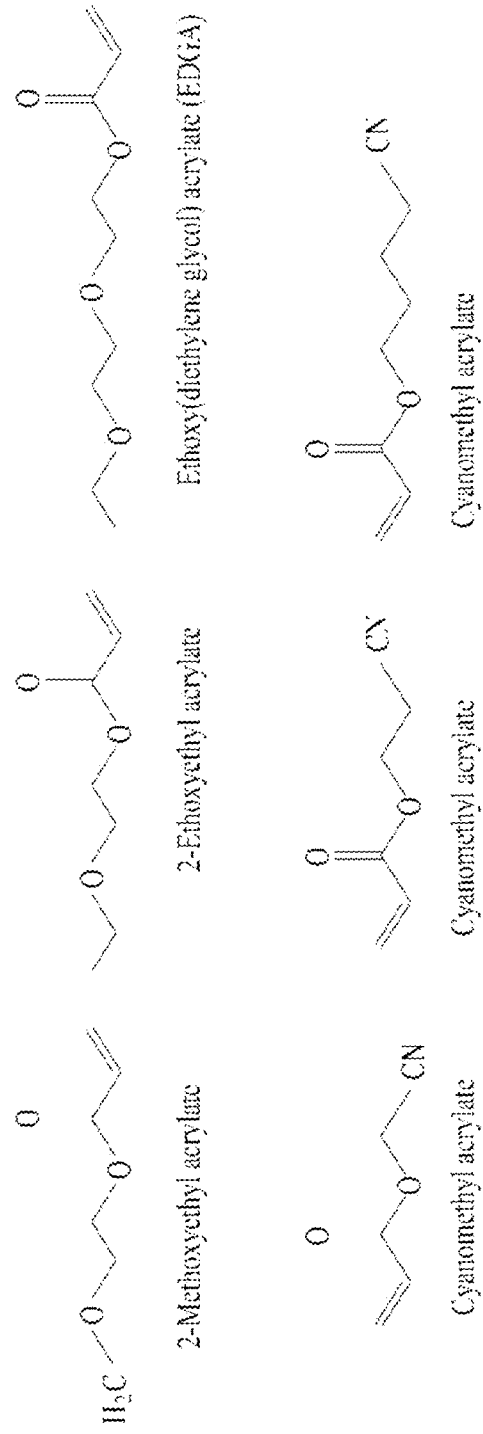
Figure 4F:
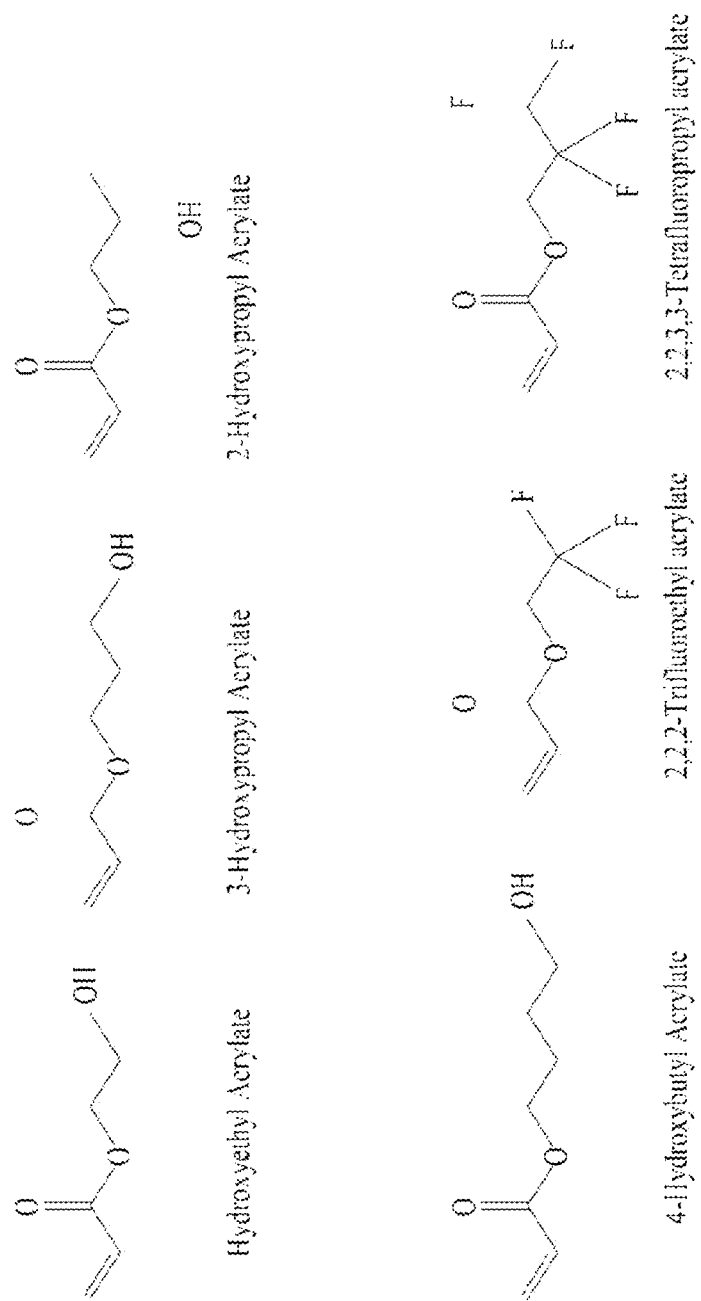
Figure 4G:
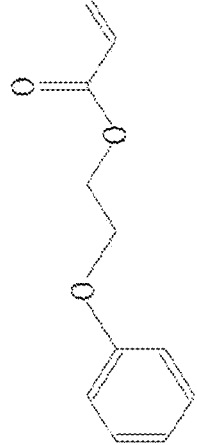
Figure 4G:
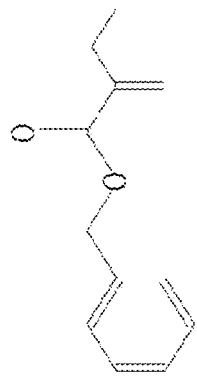
Figure 4G:
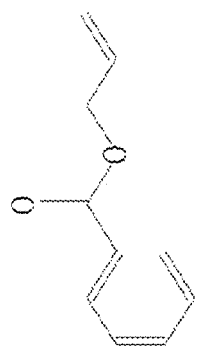
Figure 4G:
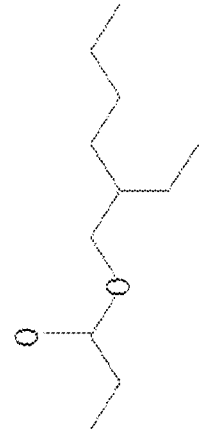
Figure 4G:
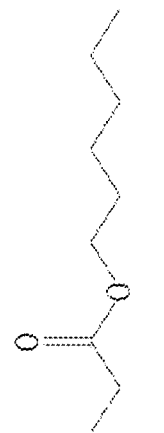
Figure 4G:
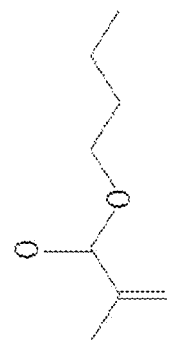
Figure 4H:
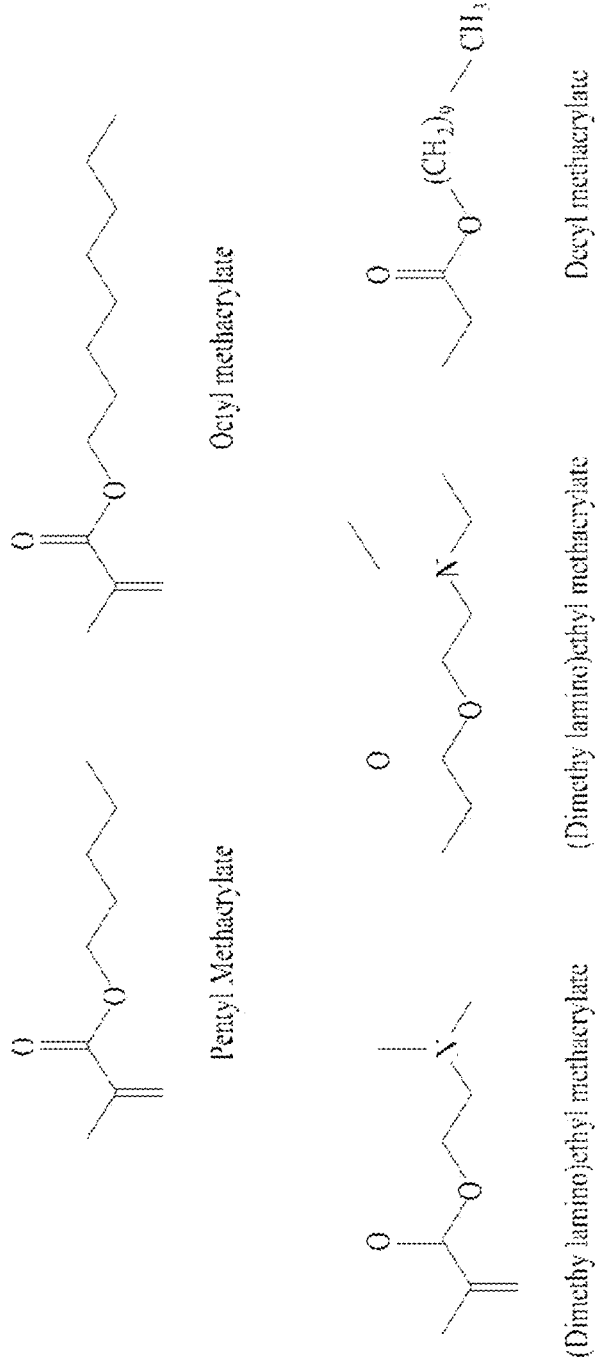
Figure 4I:
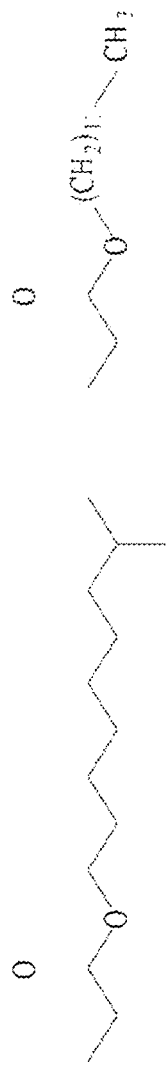
Figure 4I:
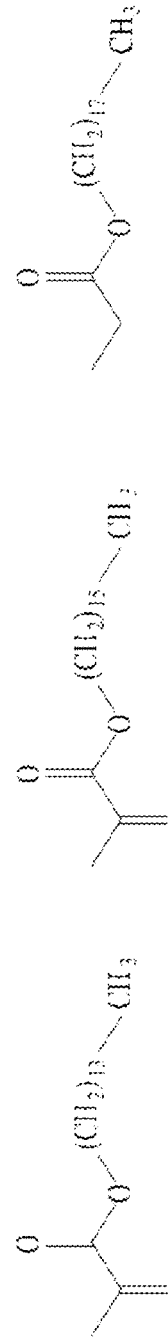

FIGS. 3A and 3B show performance results of a polymer thin film depending on a copolymer composition according to a second embodiment of the inventive concept.

Referring to FIG. 3A, in a second embodiment, a polymer thin film is formed by copolymerizing OA among acrylate-based monomers and DEGDVE among vinyl group monomers.

Referring to FIG. 3B, performance of the polymer thin film formed by adjusting a composition ratio of a soft material and a cross-linker shown in FIG. 3A may be confirmed. It may be seen that the polymer thin film formed by copolymerizing OA and DEGDVE withstands a strain of about ~60% and a breakdown voltage of 2 MV/cm or more at a thickness of 300 nm or less.

In the method for forming the polymer thin film according to an embodiment of the inventive concept through FIGS. 2A to 3B, the composition ratio of the vinyl group that is the cross-linker and the acrylate-based monomer that is the soft material may be adjusted to control the material properties of the polymer thin film, and therefore the polymer thin film formed through this may exhibit excellent stretchability and dielectric properties.

Figure 5A:
FIGS. 5A to 5C show candidates for a cross-linker according to an embodiment of the inventive concept.
Figure 5A:
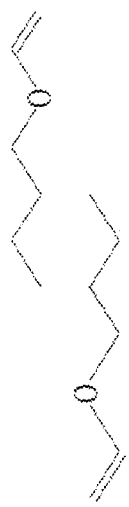
Figure 5A:
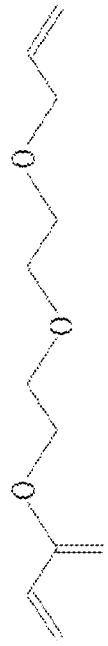
Figure 5A:
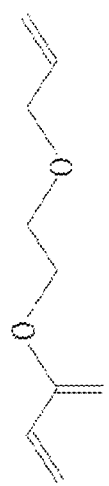
Figure 5A:
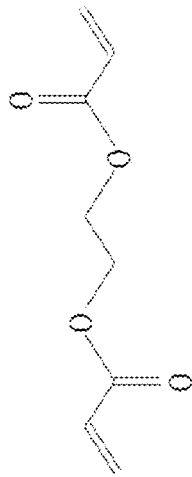
Figure 5A:
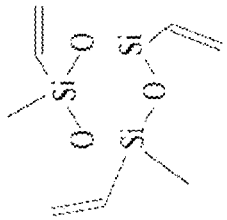
Figure 5B:
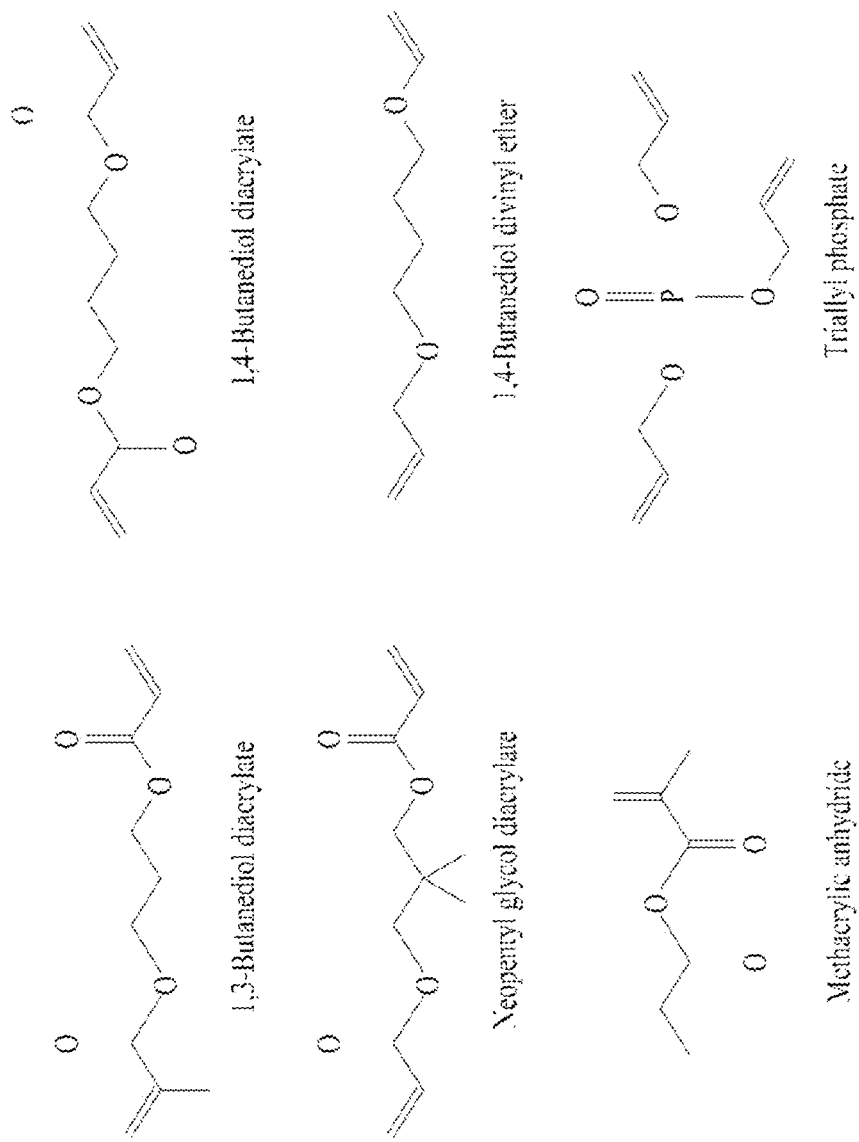
Figure 5C:
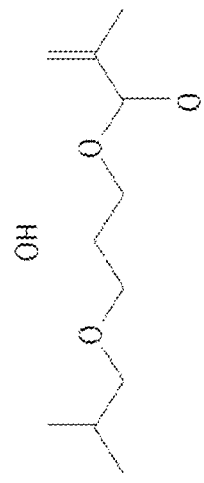
Figure 5C:
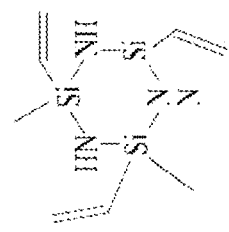
Figure 5C:
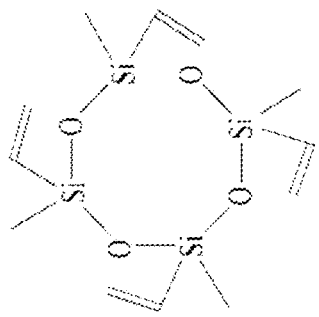
Figure 5C:
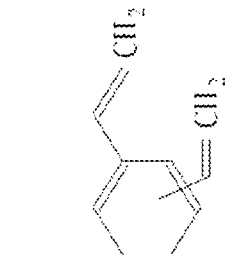
Figure 5C:
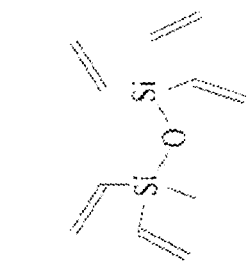

FIGS. 4A to 4I show candidates for a soft material according to an embodiment of the inventive concept, and FIGS. 5A to 5C show candidates for a cross-linker according to an embodiment of the inventive concept.

An acrylate-based monomer, which is a soft material, as illustrated in FIGS. 4A to 4I, may one of methyl acrylate, ethyl acrylate, chloroethyl acrylate, propyl acrylate, isopropyl acrylate, cyclopropyl acrylate, n-butyl acrylate, iso-butyl acrylate, tert-butyl acrylate, hexyl acrylate, n-octyl acrylate, 2-ethylhexyl acrylate, cyclohexyl acrylate, 3,3,5-trimethylcyclohexyl acrylate, n-nonyl acrylate (NA), iso-decyl acrylate (IDA), iso-nonyl acrylate (INA), n-decyl acrylate (DA), dodecyl acrylate, hexadecyl acrylate, tetrahydro tetrahydrofurfuryl acrylate, heptadecyl acrylate, 2-(dimethylamino) ethyl acrylate, 2-methoxyethyl acrylate, 2-ethoxyethyl acrylate, ethoxy(diethylene glycol) acrylate (EDGA), cyanomethyl acrylate, 2-cyanoethyl acrylate, 4-cyanobutyl acrylate, hydroxyethyl acrylate, 3-hydroxypropyl acrylate, 2-hydroxypropyl acrylate, 4-hydroxybutyl acrylate, 2,2,2-trifluoroethyl acrylate, 2,2,3,3-tetrafluoropropyl acrylate, benzyl acrylate, benzyl 2-ethylacrylate, 2-phenoxyethyl acrylate, butyl methacrylate, hexyl methacrylate, 2-ethylhexyl methacrylate, pentyl methacrylate, octyl methacrylate, (dimethylamino)ethyl methacrylate, (diethylamino)ethyl methacrylate), decyl methacrylate, isodecyl methacrylate, dodecyl methacrylate, tetradecyl methacrylate, hexadecyl methacrylate, and octadecyl methacrylate.

In addition, a monomer of a vinyl group, which is a cross-linker, as illustrated in FIGS. 5A to 5C, may be one of (1,4-cyclohexane) dimethanol divinyl ether, diethyl glycol divinyl ether, ethylene glycol dimethacrylate, di(ethylene glycol diacrylate), 1,3,5-trimethyl-1,3,5-trivinyl cyclotrisiloxane, ethylene glycol diacrylate, 1,3-butanediol diacrylate, 1,4-butanediol diacrylate, neopentyl glycol diacrylate, 1,4-butanediol divinyl ether, methacrylic anhydride, triallyl phosphate, 2,4,6-trimethyl-2,4,6-trivinylcyclotrisilazane, glycerol dimethacrylate, hexavinyldisiloxane, divinylbenzene, and, 2,4,6,8-tetramethyl-2,4,6,8-tetravinylcyclotetrasiloxane.

Of course, the cross-linker in the inventive concept is not limited to the above-described monomers of the vinyl group, and may include all kinds of cross-linkers that are capable of being used in the inventive concept.

According to an embodiment of the inventive concept, the soft material and the cross-linker may be copolymerized to form the polymer thin film having excellent stretchability and dielectric properties.

In addition, according to an embodiment of the inventive concept, the composition ratio of the soft material and the cross-linker is adjusted to control the material properties of the polymer thin film.

While this disclosure includes specific example embodiments and drawings, it will be apparent to one of ordinary skill in the art that various alterations and modifications in form and details may be made in these example embodiments. For example, suitable results may be achieved if the described techniques are performed in a different order, and/or if components in a described system, architecture, device, or circuit are combined in a different manner, and/or replaced or supplemented by other components or equivalents thereof.

Accordingly, other implementations, other embodiments, and equivalents of claims are within the scope of the following claims.

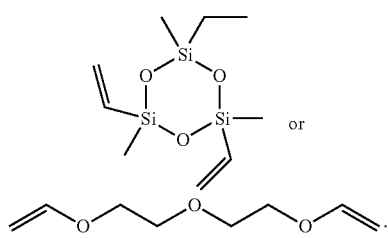

What is claimed is:

1. A method of forming a polymer thin film, the method comprising:
providing an acrylate-based monomer and a vinyl group monomer for forming the polymer thin film, wherein the acrylate-based monomer comprises an aliphatic hydrocarbon chain having 8 or more carbons and a linear structure;
selecting a ratio of the acrylate-based monomer to the vinyl group monomer, wherein the ratio determines desired stretchability and dielectric properties of the polymer thin film; and
forming the polymer thin film by copolymerizing the acrylate-based monomer and the vinyl group monomer using said selected ratio and an initiated chemical vapor deposition (iCVD) method, wherein the polymer thin film has said desired stretchability and dielectric properties.

2. The method of claim 1, wherein the polymer thin film exhibits a strain rate of 50% or more and a breakdown voltage of 1.5 MV/cm or more, at a thickness of 500 nm or less.

3. The method of claim 1, wherein the vinyl group monomer comprises two or more vinyl groups and functions as a cross-linker.

4. The method of claim 1, wherein the acrylate-based monomer is

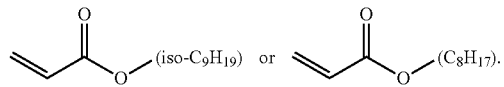

5. The method of claim 1, wherein the vinyl group monomer is